(12) United States Patent
Mo et al.

(10) Patent No.: US 12,562,562 B2
(45) Date of Patent: Feb. 24, 2026

(54) AUTOMATIC POWER OFF CIRCUIT OF NON-REBOUND SWITCHES

(71) Applicant: SNDWAY TECHNOLOGY (GUANGDONG) CO., LTD., Dongguan (CN)

(72) Inventors: Yeyi Mo, Dongguan (CN); Gang He, Dongguan (CN)

(73) Assignee: SNDWAY TECHNOLOGY (GUANGDONG) CO., LTD., Dongguan (CN)

( * ) Notice: Subject to any disclaimer, the term of this patent is extended or adjusted under 35 U.S.C. 154(b) by 276 days.

(21) Appl. No.: 18/465,173

(22) Filed: Sep. 12, 2023

(65) Prior Publication Data

US 2024/0136806 A1 Apr. 25, 2024
US 2024/0235174 A9 Jul. 11, 2024

(30) Foreign Application Priority Data

Oct. 24, 2022 (CN) .......................... 202211298865.1

(51) Int. Cl.
*H02H 3/027* (2006.01)
*H03K 17/284* (2006.01)

(52) U.S. Cl.
CPC ........... *H02H 3/027* (2013.01); *H03K 17/284* (2013.01)

(58) Field of Classification Search
CPC .... H02H 3/027; H03K 17/284; H03K 17/296; H03K 17/6871; H03K 17/567
See application file for complete search history.

(56) References Cited

FOREIGN PATENT DOCUMENTS

| CN | 201499211 U | * | 6/2010 | |
| CN | 108768364 A | * | 11/2018 | ........... H03K 17/567 |
| CN | 209046611 U | * | 6/2019 | |
| CN | 222852260 U | * | 5/2025 | |

* cited by examiner

*Primary Examiner* — Danny Nguyen
*Assistant Examiner* — Nicolas Bellido

(57) ABSTRACT

An automatic power off circuit of a non-rebound switch includes: a power switch circuit, the non-rebound switch, a trigger circuit, a controller, and a power on-off control circuit; the trigger circuit is connected with the power switch circuit and the non-rebound switch, and configured to send a turn-on signal to the power switch circuit to turn on the power switch circuit when the non-rebound switch is turned on; the controller is connected with the power switch circuit and configured to detect continuous turn-on time of the non-rebound switch and output a turn-off signal in response to the continuous turn-on time exceeding a preset timing time; the power on-off control circuit is connected with the controller, the power switch circuit and the non-rebound switch, and configured to turn off the power switch circuit by using the turn-off signal. A problem that non-rebound switches cannot be automatically powered off can be solved.

16 Claims, 2 Drawing Sheets

AUTOMATIC POWER OFF CIRCUIT OF NON-REBOUND SWITCHES

TECHNICAL FIELD

The disclosure relates to the technical field of non-rebound switches, and more particularly to an automatic power off circuit of non-rebound switches.

BACKGROUND

Switches can be divided into a rebound switch and a non-rebound switch. The rebound switch refers to a switch that can automatically return to an initial mode such as a power-on mode or power-off mode after an external force which is applied to switch the initial mode such as the power-on mode or power off mode is removed. The non-rebound switch refers to a switch that cannot return to an initial mode after an external force which is applied to switch the initial mode such as a power-on mode or power-off mode is removed. The non-rebound switch includes, for example, a boat-shaped switch, a rocker switch, a toggle switch, a self-locking switch and a switch part of a switch potentiometer, etc.

At present, the non-rebound switch can generally be used as a power switch, and it does not have an automatic power-off function, thus subsequent circuits will be in a power-on state.

There are the following problems in the prior art: because the non-rebound switch does not have the power-off function, when a user forgets to turn off the power supply, it can cause power consumption for a long time, leading to a battery to be depleted or damaged.

SUMMARY

(1) Technical Problems to be Solved

In view of the above shortcomings and deficiencies of the prior art, the disclosure provides an automatic power off circuit of non-rebound switches, which solves the problem of battery power depletion or battery damage caused by non-rebound switches not having the automatic power off function in the prior art.

(2) Technical Solutions

In order to achieve the above purpose, a main technical solution adopted by the disclosure is as follows.

An embodiment of the disclosure provides an automatic power off circuit of a non-rebound switch, the automatic power off circuit includes: a power switch circuit, the non-rebound switch, a trigger circuit, a controller, and a power on-off control circuit; the trigger circuit is connected with the power switch circuit and the non-rebound switch, and the trigger circuit is configured to send a turn-on signal to the power switch circuit to turn on the power switch circuit when the non-rebound switch is turned on; the controller is connected with the power switch circuit, and the controller is configured to detect continuous turn-on time of the non-rebound switch and output a turn-off signal in response to the continuous turn-on time exceeding a preset timing time; and the power on-off control circuit is connected with the controller, the power switch circuit and the non-rebound switch, and the power on-off control circuit is configured to turn off the power switch circuit by using the turn-off signal.

Therefore, compared with the prior art, the automatic power off circuit of the non-rebound switch effectively solves the problem that the non-rebound switch cannot be automatically powered off.

In an embodiment, the power switch circuit includes a positive channel metal-oxide-semiconductor (PMOS) transistor Q2, a resistor R2 and a resistor R3; a source (S) electrode of the PMOS transistor Q2 is connected with an end of the resistor R2; a gate (G) electrode of the PMOS transistor Q2 is connected with another end of the resistor R2 and an end of the resistor R3; another end of the resistor R3 is connected with the trigger circuit and the power on-off control circuit; and a drain (D) electrode of the PMOS transistor Q2 is connected to the controller.

In an embodiment, the trigger circuit includes a PMOS transistor Q3, a resistor R4, a resistor R5, a resistor R6, a negative channel metal-oxide-semiconductor (NMOS) transistor Q4, a capacitor C5, a diode D1, a resistor R7, and a negative-positive-negative (NPN) type triode Q5; a S electrode of the PMOS transistor Q3 is connected with the end of the resistor R2, the S electrode of the PMOS transistor Q2, and an end of the resistor R4; a G electrode of the PMOS transistor Q3 is connected with an end of the resistor R5; a D electrode of the PMOS transistor Q3 is connected with an end of the resistor R6 and an end of the capacitor C5; another end of the resistor R4 is connected with another end of the resistor R5, a G electrode of the NMOS transistor Q4, and an end of the non-rebound switch; another end of the resistor R6 is connected with a D electrode of the NMOS transistor Q4; a S electrode of the NMOS transistor Q4 is grounded; another end of the capacitor C5 is connected to a negative electrode (i.e., cathode) of the diode D1 and an end of the resistor R7; a positive electrode (i.e., anode) of the diode D1 is grounded; another end of the resistor R7 is connected with a base (B) electrode of the NPN type triode Q5; a collector (C) electrode of the NPN type triode Q5 is connected to the another end of the resistor R3 and the power on-off control circuit; and an emitter (E) electrode of the NPN type triode Q5 is grounded.

In an embodiment, the power on-off control circuit includes a NPN type triode Q6, a resistor R8 and a resistor R9; a C electrode of the NPN type triode Q6 is connected with the another end of the resistor R3 and the C electrode of the NPN type triode Q5; an E electrode of the NPN transistor Q6 is connected with the another end of the resistor R4, the another end of the resistor R5, the G electrode of the NMOS transistor Q4 and the non-rebound switch; a B electrode of the NPN type triode Q6 is connected with an end of the resistor R8; another end of the resistor R8 is connected with an end of the resistor R9 and a first port of the controller; and another end of the resistor R9 is grounded.

In an embodiment, another end of the non-rebound switch is grounded.

In an embodiment, the automatic power off circuit further includes: a power supply and an anti-reverse connection circuit; the anti-reverse connection circuit is connected with the power supply and the power switch circuit, and the anti-reverse connection circuit is configured to prevent the power supply from reverse connection.

In an embodiment, the anti-reverse connection circuit includes a PMOS transistor Q1 and a resistor R1; a D electrode of the PMOS transistor Q1 is connected with the power supply; a G electrode of the PMOS transistor Q1 is connected with an end of the resistor R1; another end of the resistor R1 is grounded; and a S electrode of the PMOS transistor Q1 is connected with the power switch circuit.

In an embodiment, the automatic power off circuit further includes: a voltage-regulator circuit, connected with the power switch circuit and the controller; and the voltage-regulator is configured to provide a stable voltage to the controller.

In an embodiment, the voltage-regulator circuit includes a capacitor C1, a capacitor C2, a voltage-regulator chip U1, a capacitor C3 and a capacitor C4; an end of the capacitor C1 is connected with the power switch circuit, an end of the capacitor C2, a pin 1 of the voltage-regulator chip U1 and a pin 3 of the voltage-regulator chip U1; a pin 5 of the voltage-regulator chip U1 is connected with an end of the capacitor C3, an end of the capacitor C4, and a second port of the controller; and another end of the capacitor C1, another end of the capacitor C2, a pin 2 of the voltage-regulator chip U1, another end of the capacitor C3 and another end of the capacitor C4 are all grounded.

In an embodiment, the controller is a single chip micro-computer U2.

In order to make the above-mentioned purposes, features and advantages realized by the embodiments of the disclosure more obvious and easier to understand, the following is a detailed description of preferred embodiments with the attached drawings.

BRIEF DESCRIPTION OF DRAWINGS

In order to provide a clearer explanation of the technical solutions of the embodiments of the disclosure, a brief introduction will be given to the accompanying drawings required in the embodiments of the disclosure. It should be understood that the following drawings only illustrate certain embodiments of the disclosure, and therefore should not be regarded as limiting the scope. For those skilled in the art, other relevant drawings can also be obtained based on these drawings without creative labor.

DETAILED DESCRIPTION OF EMBODIMENTS

In order to better explain the disclosure and facilitate understanding, the following is a detailed description of the disclosure through specific implementation ways in conjunction with the accompanying drawings.

In addition to causing battery depletion or damage, a non-rebound switch in the prior art acts as a power switch, and the non-rebound switch is turned on when a large current directly flow through the non-rebound switch, internal metal contacts of the non-rebound switch are prone to sparking, leading to oxidation and damage to the metal contacts, resulting in a shorter server life of the non-rebound switch.

Based on this, an embodiment of the disclosure provides an automatic power off circuit of a non-rebound switch, which includes a power switch circuit, the non-rebound switch, a trigger circuit, a controller and a power on-off control circuit. The trigger circuit is connected to the power switch circuit and the non-rebound switch, and the trigger circuit is configured to send a turn-on signal to the power switch circuit to turn on (i.e., start) the power switch circuit when the non-rebound switch is turned on. The controller is connected to the power switch circuit, and is configured to detect continuous turn-on time of the non-rebound switch, and output a turn-off signal in response to the continuous turn-on time exceeding preset timing time. The power on-off control circuit is connected to the controller, the power switch circuit, and the non-rebound switch; and the power on-off control circuit is configured to turn off the power switch circuit by using the turn-off signal.

Therefore, the disclosure effectively solves the problem that the non-rebound switch cannot be automatically powered off through the above-mentioned automatic power off circuit.

In order to better understand the above technical solutions, exemplary embodiments of the disclosure will be described in more detail below with reference to the accompanying drawings. Although the exemplary embodiments of the disclosure are shown in the accompanying drawings, it should be understood that the disclosure can be implemented in various forms and should not be limited by the embodiments described here. On the contrary, these embodiments are provided in order to have a clearer and more thorough understanding of the disclosure, and to fully convey the scope of the disclosure to those skilled in the art.

Figure 1:
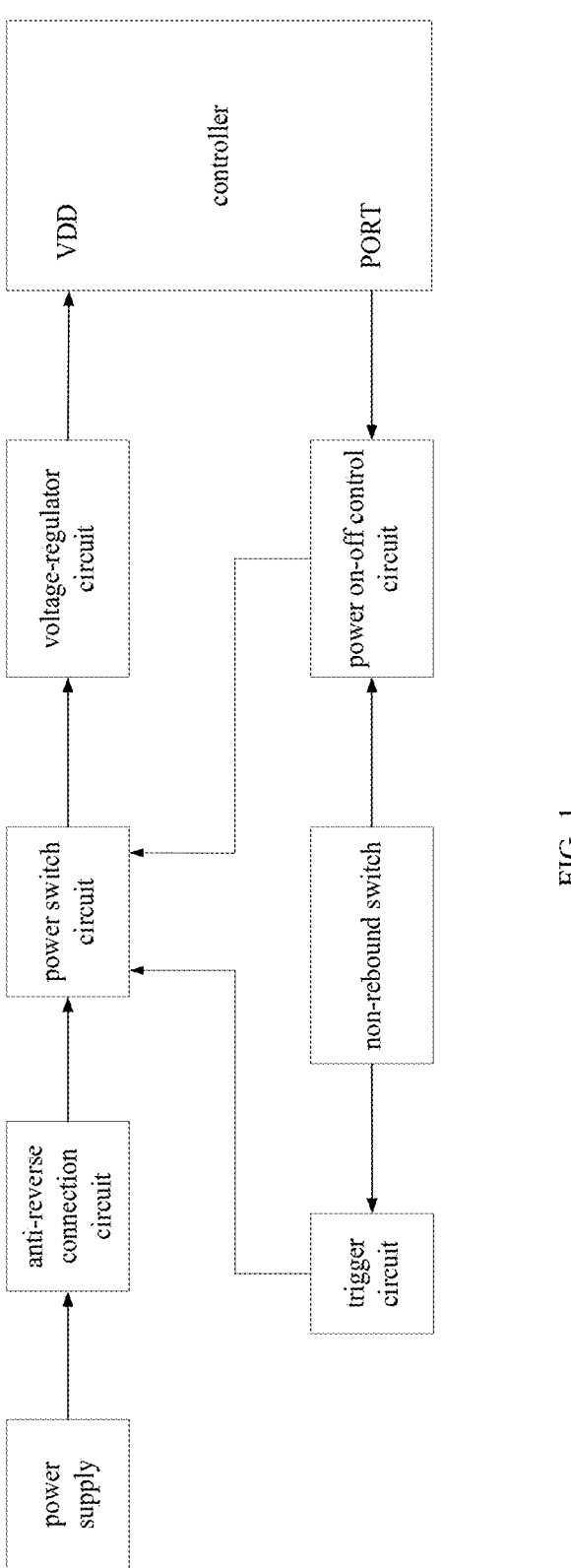
FIG. 1 illustrates a schematic diagram of an automatic power off circuit of a non-rebound switch according to an embodiment of the disclosure.

Please refer to FIG. 1, which illustrates a schematic diagram of an automatic power off circuit of a non-rebound switch according to an embodiment of the disclosure. The automatic power off circuit illustrated in FIG. 1 includes a power supply, an anti-reverse connection circuit configured to prevent a reverse connection of the power supply, a power switch circuit configured to control the power supply to be turned on or off, a voltage-regulator circuit configured to provide a stable voltage, a controller, a trigger circuit, a non-rebound switch and a power on-off control circuit. Specifically, the anti-reverse connection circuit is connected with the power supply and the power switch circuit individually; the power switch circuit is connected with the voltage-regulator circuit, the trigger circuit and the power on-off control circuit individually; the non-rebound switch is connected with the trigger circuit and the power on-off control circuit individually; and the controller is connected with the voltage-regulator circuit and the power on-off control circuit individually. It should be noted that the trigger circuit and the power on-off control circuit together form a main control circuit.

It should be noted that although FIG. 1 illustrates the connection between the power switch circuit and the controller through the voltage-regulator circuit, those skilled in the art should understand that the controller can also be directly connected to the power switch circuit, and the embodiment of the disclosure is not limited to this.

On the basis of the above circuit, an output voltage of the power supply passes through the anti-reverse connection circuit, the power switch circuit, and the voltage-regulator circuit, and finally to the controller for providing supply power. The power switch circuit can control the power supply to turn on or off, the power switch circuit can be controlled by the trigger circuit and the power on-off control circuit, the trigger circuit can be controlled by the non-rebound switch, and the power on-off control circuit can be jointly controlled by the non-rebound switch and the controller.

That is to say, when the non-rebound switch is turned on, the trigger circuit can send a turn-on signal to the power switch circuit to turn on the power switch circuit, thus turning on the power supply. The controller can detect the continuous turn-on time of the non-rebound switch, and output a turn-off signal to the power on-off control circuit after the continuous turn-on time exceeds the preset timing time. The power on-off control circuit can turn off the power switch circuit by using the turn-off signal, so as to turn off the power supply.

It should be understood that a specific signal of the turn-on signal, specific time of the preset timing time and a specific signal of the turn-off signal can be set according to actual needs, and the embodiment of the disclosure is not limited to this.

For example, the turn-on signal can be a low-level signal, etc.

For example, the preset timing time can be 3 hours or 10 hours, etc.

In order to facilitate the understanding of an operation process of the automatic power off circuit, the following will be described through a specific embodiment.

Specifically, when the non-rebound switch is turned on, the trigger circuit can send a low-level signal to the power switch circuit. After the power switch circuit receives the low-level signal, the power switch circuit can be turned on, and after the power switch circuit is turned on, the voltage-regulator circuit can output a stable voltage to make the controller work normally. After the controller works normally, the power on-off control circuit can output a low-level signal. And after the power on-off control circuit outputs the low-level signal, an output of the trigger circuit becomes open. The controller can detect the continuous turn-on time of the non-rebound switch, and output a turn-off signal after the continuous turn-on time exceeds the preset timing time. And after the power on-off control circuit receives the turn-off signal, an output of the power on-off control circuit becomes open, and after the output of the power on-off control circuit becomes open, the power switch circuit becomes open, thus realizing the power-off.

The output of the power on-off control circuit becomes open when the non-rebound switch is turned off, and after the output of the power on-off control circuit becomes open, the power switch circuit becomes open, so that the power-off can also be realized.

It should be understood that the specific structure of the power supply can be set according to the actual needs, and the embodiment of the disclosure is not limited to this.

Figure 2:
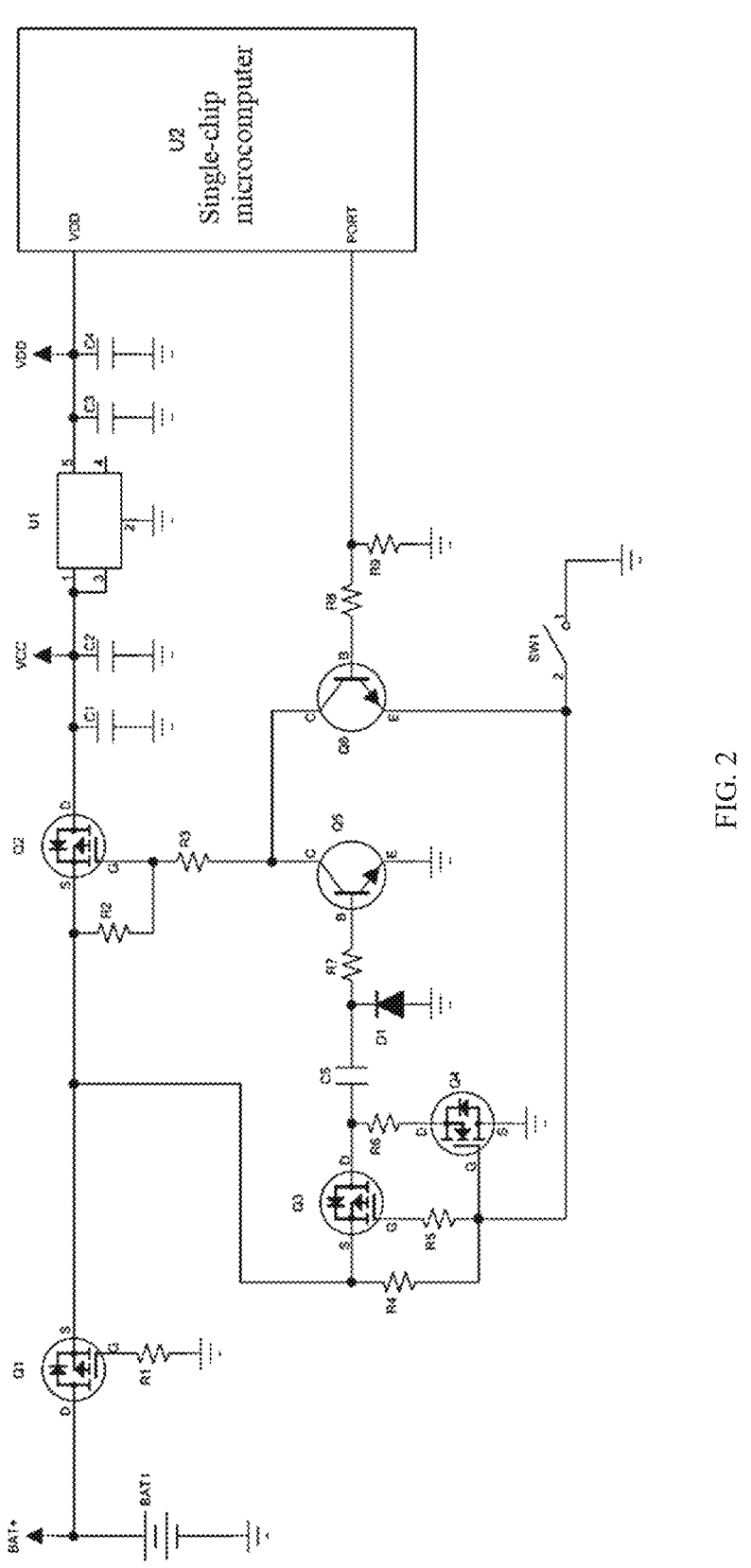
FIG. 2 illustrates a specific schematic diagram of an automatic power off circuit of a non-rebound switch according to an embodiment of the disclosure.

For example, as shown in FIG. 2, FIG. 2 illustrates a specific schematic diagram of an automatic power off circuit of a non-rebound switch according to an embodiment of the disclosure, and the power supply can be a battery (BAT1). For another example, the power supply can be a direct current power supply (DC power supply).

It should also be understood that the specific structure of the controller can also be set according to actual needs, and the embodiment of the disclosure is not limited to this.

For example, with continued reference to FIG. 2, the controller can be a single chip microcomputer (U2).

For another example, the controller can be another timing device.

It should also be understood that the specific structure of the non-rebound switch can also be set according to the actual needs, and the embodiment of the disclosure is not limited to this.

For example, with continued reference to FIG. 2, the non-rebound switch may be a switch SW1.

It should also be understood that the specific structure of the anti-reverse connection circuit can also be set according to actual needs, and the embodiment of the disclosure is not limited to this.

Optionally, referring to FIG. 2, the anti-reverse connection circuit includes a PMOS transistor Q1 and a resistor R1. Specifically, a D electrode of the PMOS transistor Q1 is connected with the battery BAT1, a G electrode of the PMOS transistor Q1 is connected with an end of the resistor R1, the other end of the resistor R1 is grounded, and a S electrode of the PMOS transistor Q1 is connected with the power switch circuit (for example, in a case that the power switch circuit includes a PMOS transistor Q2 and a resistor R2, the S electrode of the PMOS transistor Q1 is individually connected with an end of the resistor R2 and a S electrode of the PMOS transistor Q2).

On the basis of the above circuit, a working principle of the anti-reverse connection circuit is as follows: when the power supply is powered in a forward direction, a voltage of the G electrode of the PMOS transistor Q1 is 0 V, a voltage of the D electrode of the PMOS transistor Q1 is high, and an internal parasitic diode of the PMOS transistor Q1 is turned on, and a voltage of the S electrode of the PMOS transistor Q1 is higher than the voltage of the G electrode of the PMOS transistor Q1, so that the PMOS transistor Q1 is turned on. When the power supply is powered in a reverse direction, the voltage of the G electrode of the PMOS transistor Q1 is high, and the voltage of the D electrode of the PMOS transistor Q1 is 0 V, so the internal parasitic diode of the PMOS transistor Q1 is turned off, and the voltage of the G electrode of the PMOS transistor Q1 is higher than the voltage of the S electrode of the PMOS transistor Q1, and the PMOS transistor Q1 is turned off.

It should be noted here that the PMOS transistor Q1 can also be referred as a first PMOS transistor. Correspondingly, other components are similar and will not be described one by one.

For example, the resistor R1 can also be referred as a first resistor. For another example, the PMOS transistor Q2 can also be referred as a second PMOS transistor. For another example, the resistor R2 can also be referred as a second resistor.

It should also be understood that the specific structure of the power switch circuit can also be set according to actual needs, and the embodiment of the disclosure is not limited to this.

Optionally, referring to FIG. 2, the power switch circuit includes a PMOS transistor Q2, a resistor R2 and a resistor R3. The S electrode of the PMOS transistor Q2 is connected with an end of the resistor R2, a G electrode of the PMOS transistor Q2 is connected with the other end of the resistor R2 and an end of the resistor R3 individually, the other end of the resistor R3 is connected with the trigger circuit and the power on-off control circuit individually (for example, in a case that the trigger circuit includes a NPN type triode Q5, the other end of the resistor R3 is connected with a C electrode of the NPN type triode Q5. For another example, in a case that the power on-off control circuit includes a NPN type triode Q6, the other end of the resistor R3 is connected with a C electrode of the NPN type triode Q6), and a D electrode of the PMOS transistor Q2 is connected with the single chip microcomputer U2 through the voltage-regulator circuit.

On the basis of the above circuit, a working principle of the power switch circuit is as follows: the resistor R2 is connected between the G electrode of the PMOS transistor Q2 and the S electrode of the PMOS transistor Q2, and the G electrode of the PMOS transistor Q2 is connected to the trigger circuit and the power on-off control circuit through the resistor R3. In general, a resistance of the resistor R2 is 2 to 20 times that of the resistor R3. When the trigger circuit or the power on-off control circuit outputs a low level to the resistor R3, the G electrode of the PMOS transistor Q2 is at a low level, and the PMOS transistor Q2 is turned on. When the output of the trigger circuit or the power on-off control circuit becomes open, or is a high level to the resistor R3, the G electrode of the PMOS transistor Q2 is at a high level, and the PMOS transistor Q2 is turned off.

It should also be understood that the specific structure of the voltage-regulator circuit can also be set according to actual needs, and the embodiment of the disclosure is not limited to this.

Optionally, continuing to refer to FIG. 2, the voltage-regulator circuit includes a capacitor C1, a capacitor C2, a voltage-regulator chip U1, a capacitor C3, and a capacitor C4. An end of the capacitor C1 is individually connected to the D electrode of the PMOS transistor Q2 of the power switch circuit, an end of the capacitor C2, a pin 1 of the voltage-regulator chip U1 and a pin 3 of the voltage-regulator chip U1; a pin 5 of the voltage-regulator chip U1 is individually connected to an end of the capacitor C3, an end of the capacitor C4, and a second port VDD of the single chip microcontroller U2; and the other end of the capacitor C1, the other end of the capacitor C2, a pin 2 of the voltage-regulator chip U1, the other end of the capacitor C3, and the other end of the capacitor C4 are all grounded.

It should also be understood that the specific structure of the trigger circuit can also be set according to actual needs, and the embodiment of the disclosure is not limited to this.

Optionally, continuing to refer to FIG. 2, the trigger circuit includes a PMOS transistor Q3, a resistor R4, a resistor R5, a resistor R6, a NMOS transistor Q4, a capacitor C5, a diode D1, a resistor R7, and a NPN type triode Q5.

A S electrode of the PMOS transistor Q3 is individually connected with the end of the resistor R2, the S electrode of the PMOS transistor Q2 and an end of the resistor R4; the G electrode of the PMOS transistor Q3 is connected with an end of the resistor R5, a D electrode of the PMOS transistor Q3 is individually connected with an end of the resistor R6 and an end of the capacitor C5; the other end of the resistor R4 is individually connected with the other end of the resistor R5, a G electrode of the NMOS transistor Q4 and an end of the non-rebound switch SW1; the other end of the resistor R6 is connected with a D electrode of the NMOS transistor Q4; a S electrode of the NMOS transistor Q4 is grounded; the other end of the capacitor C5 is individually connected with a negative electrode of the diode D1 and an end of the resistor R7; a positive electrode of the diode D1 is grounded; the other end of the resistor R7 is connected with a B electrode of the NPN type triode Q5; a C electrode of the NPN type triode Q5 is individually connected with the other end of the resistor R3 and the power on-off control circuit (for example, in a case that the power on-off control circuit includes a NPN type triode Q6, the C electrode of the NPN type triode Q5 is connected with a C electrode of the NPN type triode Q6), and a E electrode of the NPN type triode Q5 is grounded.

On the basis of the above circuit, a working principle of the trigger circuit is as follows: when the non-rebound switch SW1 becomes open (i.e., is turned off), the PMOS transistor Q3 is turned off, the NMOS transistor Q4 is turned on, and the capacitor C5, the resistor R6, the NMOS transistor Q4 and the diode D1 form a discharge loop. When the non-rebound switch SW1 is turned on, the PMOS transistor Q3 is turned on, the NMOS transistor Q4 is turned off, and the capacitor C5, the PMOS transistor Q3, the resistor R7 and a BE junction of the NPN type triode Q5 form a charging loop. During the charging process of the capacitor C5, the BE junction of the NPN type triode Q5 in the charging loop has a current flowing, and the NPN type triode Q5 is turned on and outputs a low level. Values of the capacitor C5 and the resistor R7 are adjusted so as to have enough charging time, ensure that the turn-on time of the NPN type triode Q5 is more than 0.5 seconds, and output a low level to drive the power switch circuit to turn on. A value of the resistor R6 is adjusted so that the capacitor C5 can discharge more than 80% within 0.1 second.

In addition, when the non-rebound switch SW1 is turned on, after automatic power off, the main current loop in the trigger circuit is formed by the resistor R4 and the non-rebound switch SW1. When the non-rebound switch SW1 is turned off, the resistor R4 is a pull-up resistor of the G electrode of the PMOS transistor Q3 and the G electrode of the NMOS transistor Q4. The value of the resistor R4 can be in a range of 1 MΩ to 10 MΩ, so that the power consumption of the circuit is small enough after the automatic power off, and the voltage rise time of the G electrode of the PMOS transistor Q3 and the G electrode of the NMOS transistor Q4 should not be too long at the moment when the non-rebound switch SW1 is turned on to off, so as to avoid affecting the discharge process of the capacitor C5.

Therefore, because the current flowing through the non-rebound switch is very small, the disclosure effectively solves the problem that when the switch is turned on, the metal contacts inside the non-rebound switch are prone to sparking, leading to oxidation and damage of the metal contacts, resulting in a short server life of the non-rebound switch.

It should also be understood that the specific structure of the power on-off control circuit can also be set according to actual needs, and the embodiment of the disclosure is not limited to this.

Optionally, referring to FIG. 2, the power on-off control circuit includes a NPN type triode Q6, a resistor R8 and a resistor R9; a C electrode of the NPN type triode Q6 is individually connected with the other end of the resistor R3 and the C electrode of the NPN type triode Q5; an E electrode of the NPN type triode Q6 is individually connected with the other end of the resistor R4, the other end of the resistor R5, the G electrode of the NMOS transistor Q4 and the end of the non-rebound switch SW1; a B electrode of the NPN type triode Q6 is connected with the end of the resistor R8 and the other end of the resistor R8 is connected with an end of the resistor R9 and a first port PORT of the single chip microcomputer; the other end of the non-rebound switch SW1 is grounded, and the other end of the resistor R9 is also grounded.

On the basis of the above circuit, a working principle of the power on-off control circuit is as follows: when the non-rebound switch SW1 is turned on, the PORT of the single chip microcomputer outputs a high level between the resistor R8 and the resistor R9, and the C electrode of the NPN type triode Q6 outputs a low level to drive the power switch circuit to turn on. When the non-rebound switch SW1 is turned off, the PORT of the single chip microcomputer outputs a low level between the resistor R8 and the resistor R9, the output of the C electrode of the NPN type triode Q6 becomes open, the power switch circuit becomes open when the trigger circuit also becomes open. During the open circuit of the non-rebound switch SW1, the E electrode of the NPN type triode Q6 becomes open, so the output of the C electrode of the NPN type triode Q6 becomes open, at this time, the trigger circuit becomes open, and the power switch circuit becomes open.

To sum up, the automatic power off circuit effectively solves the problem that the non-rebound switch cannot be automatically powered off.

It should be noted here that the application scenario of the automatic power off circuit of the non-rebound switch in the embodiment of the disclosure is suitable for the related scenarios with non-rebound switches. For example, the scene of controlling the power supply on or off through the rocker switch, etc.

It should be understood that the automatic power off circuit of the non-rebound switch mentioned above is only exemplary. Those skilled in the art can perform various deformations based on the automatic power off circuit mentioned above, and the modified or deformed content is also within the scope of protection of the disclosure.

In the description of the disclosure, it should be understood that the terms "first" and "second" are only used for descriptive purposes and cannot be understood as indicating or implying relative importance or implying the number of indicated technical features. Therefore, features limited to "first" and "second" can explicitly or implicitly include one or more of these features. In the description of the disclosure, "multiple" means two or more, unless otherwise specifically defined.

In the disclosure, unless otherwise specified and limited, the terms "installation", "connection", "fixation" and other terms should be broadly understood. For example, the term "connection" can be fixed connection, detachable connection, or integrated; It can be a mechanical connection or an electrical connection; It can be directly connected or indirectly connected through an intermediate media; It can be an internal connection between two components or an interaction relationship between two components. For those skilled in the art, the specific meanings of the above terms in the disclosure can be understood based on specific circumstances.

In the disclosure, unless otherwise specified and limited, the first feature is "above" or "below" the second feature, which may be direct contact between the first and second features or indirect contact between the first and second features through an intermediary. Moreover, the first feature is "above" and "on" the second feature, which may mean that the first feature is directly above or obliquely above the second feature, or just means that the horizontal height of the first feature is higher than the second feature. The first feature is "below" the second feature, which can mean that the first feature is directly below or obliquely below the second feature, or just means that the horizontal height of the first feature is lower than the second feature.

In the description of the disclosure, the terms "one embodiment", "some embodiments", "embodiments", "examples", "specific examples", or "some examples" refer to the specific features, structures, materials, or characteristics described in conjunction with the embodiments or examples being included in at least one embodiment or example of the disclosure. In this specification, the schematic expressions of the above terms do not necessarily refer to the same embodiments or examples. Moreover, the specific features, structures, materials, or characteristics described can be combined in an appropriate manner in any one or more embodiments or examples. In addition, those skilled in the art may combine the different embodiments or examples described in this specification, as well as the features of different embodiments or examples, without mutual contradiction.

Although embodiments of the disclosure have been shown and described above, it can be understood that the above embodiments are exemplary and cannot be understood as a limitation of the disclosure. Those skilled in the art can modify, amend, replace, and change the above embodiments within the scope of the disclosure.

What is claimed is:

1. An automatic power off circuit of a non-rebound switch, comprising:

a power switch circuit and the non-rebound switch;

a trigger circuit, connected with the power switch circuit and the non-rebound switch; wherein the trigger circuit is configured to send a turn-on signal to the power switch circuit to turn on the power switch circuit when the non-rebound switch is turned on;

a controller, connected with the power switch circuit; wherein the controller is configured to detect continuous turn-on time of the non-rebound switch and output a turn-off signal in response to the continuous turn-on time exceeding a preset timing time; and a power on-off control circuit, connected with the controller, the power switch circuit and the non-rebound switch; wherein the power on-off control circuit is configured to turn off the power switch circuit by using the turn-off signal;

wherein the power switch circuit comprises a positive channel metal-oxide-semiconductor (PMOS) transistor (Q2), a second resistor (R2) and a third resistor (R3); and wherein a source(S) electrode of the PMOS transistor (Q2) is connected with an end of the second resistor (R2); a gate (G) electrode of the PMOS transistor (Q2) is connected with another end of the second resistor (R2) and an end of the third resistor (R3); another end of the third resistor (R3) is connected with the trigger circuit and the power on-off control circuit; and a drain (D) electrode of the PMOS transistor (Q2) is connected to the controller;

wherein the trigger circuit comprises a PMOS transistor (Q3), a fourth resistor (R4), a fifth resistor (R5), a sixth resistor (R6), a negative channel metal-oxide-semiconductor (NMOS) transistor (Q4), a fifth capacitor (C5), a diode (D1), a seventh resistor (R7), and a negative-positive-negative (NPN) type triode (Q5); and wherein a S electrode of the PMOS transistor (Q3) is connected with the end of the second resistor (R2), the S electrode of the PMOS transistor (Q2), and an end of the fourth resistor (R4); a G electrode of the PMOS transistor (Q3) is connected with an end of the fifth resistor (R5); a D electrode of the PMOS transistor (Q3) is connected with an end of the sixth resistor (R6) and an end of the fifth capacitor (C5); another end of the fourth resistor (R4) is connected with another end of the fifth resistor (R5), a G electrode of the NMOS transistor (Q4), and an end of the non-rebound switch; another end of the sixth resistor (R6) is connected with a D electrode of the NMOS transistor (Q4); a S electrode of the NMOS transistor (Q4) is grounded; another end of the fifth capacitor (C5) is connected to a negative electrode of the diode (D1) and an end of the seventh resistor (R7); a positive electrode of the diode (D1) is grounded; another end of the seventh resistor (R7) is connected with a base (B) electrode of the NPN type triode (Q5); a collector (C) electrode of the NPN type triode (Q5) is connected to the another end of the third resistor (R3) and the power on-off control circuit; and an emitter (E) electrode of the NPN type triode (Q5) is grounded.

2. The automatic power off circuit as claimed in claim 1, wherein the power on-off control circuit comprises a NPN type triode (Q6), an eighth resistor (R8) and a ninth resistor (R9); and wherein a C electrode of the NPN type triode (Q6) is connected with the another end of the third resistor (R3) and the C electrode of the NPN type triode (Q5); a E electrode of the NPN transistor (Q6) is connected with the another end of the fourth resistor (R4), the another end of the fifth resistor (R5), the G electrode of the NMOS transistor (Q4) and the non-rebound switch; a B electrode of the NPN type triode (Q6) is connected with an end of the eighth resistor (R8); another end of the eighth resistor (R8) is connected with an end of the ninth resistor (R9) and a first port of the controller; and another end of the ninth resistor (R9) is grounded.

3. The automatic power off circuit as claimed in claim 1, wherein another end of the non-rebound switch is grounded.

4. The automatic power off circuit as claimed in claim 1, wherein the automatic power off circuit further comprises:

a power supply; and an anti-reverse connection circuit, connected with the power supply and the power switch circuit;

wherein the anti-reverse connection circuit is configured to prevent the power supply from reverse connection.

5. The automatic power off circuit according to claim 4, wherein the anti-reverse connection circuit comprises a PMOS transistor (Q1) and a first resistor (R1); and wherein a D electrode of the PMOS transistor (Q1) is connected with the power supply; a G electrode of the PMOS transistor (Q1) is connected with an end of the first resistor (R1); another end of the first resistor (R1) is grounded; and a S electrode of the PMOS transistor (Q1) is connected with the power switch circuit.

6. The automatic power off circuit according to claim 1, wherein the automatic power off circuit further comprises:

a voltage-regulator circuit, connected with the power switch circuit and the controller; wherein the voltage-regulator is configured to provide a stable voltage to the controller.

7. The automatic power off circuit according to claim 6, wherein the voltage-regulator circuit comprises a first capacitor (C1), a second capacitor (C2), a voltage-regulator chip (U1), a third capacitor (C3) and a fourth capacitor (C4); and wherein an end of the first capacitor (C1) is connected with the power switch circuit, an end of the second capacitor (C2), a first pin (1) of the voltage-regulator chip (U1) and a third pin (3) of the voltage-regulator chip (U1); a fifth pin (5) of the voltage-regulator chip (U1) is connected with an end of the third capacitor (C3), an end of the fourth capacitor (C4), and a second port of the controller;

and another end of the first capacitor (C1), another end of the second capacitor (C2), a second pin (2) of the voltage-regulator chip (U1), another end of the third capacitor (C3) and another end of the fourth capacitor (C4) are all grounded.

8. The automatic power off circuit according to claim 1, wherein the controller is a single chip microcomputer (U2).

9. The automatic power off circuit according to claim 1, wherein a resistance of the second resistor (R2) is 2 to 20 times of a resistance of the third resistor (R3).

10. The automatic power off circuit according to claim 1, wherein a resistance of the fourth resistor (R4) is in a range of 1 million-ohm (MΩ) to 10 MΩ.

11. An automatic power off circuit, comprising:

a power supply;

a power switch circuit, connected with the power supply;

a controller, connected with the power switch circuit;

a main control circuit, connected with the controller, the power supply and the power switch circuit;

a non-rebound switch, connected with the main control circuit;

a power on-off control circuit, connected with the controller; and a trigger circuit, connected with the power supply, the power switch circuit, the non-rebound switch and the power on-off control circuit;

wherein the main control circuit is configured to output a turn-on signal to the power switch circuit in response to the non-rebound switch being turned on; and the power switch circuit is configured to turn on the power supply in response to the turn-on signal; and wherein the controller is configured to detect continuous turn-on time of the non-rebound switch and output a turn-off signal in response to the continuous turn-on time exceeding a preset timing time;

and the main control circuit is configured to turn off the power switch circuit in response to the turn-off signal, to thereby turn off the power supply;

wherein the trigger circuit is configured to output the turn-on signal to the power switch circuit in response to the non-rebound switch being turned on; and the power on-off control circuit is configured to turn off the power switch circuit in response to the turn-off signal, to thereby turn off the power supply;

wherein the power on-off control circuit comprises a NPN type triode (Q6), an eighth resistor (R8) and a ninth resistor (R9); and wherein a C electrode of the NPN type triode (Q6) is connected with the power switch circuit and the trigger circuit; an E electrode of the NPN transistor (Q6) is connected with the trigger circuit and the non-rebound switch; a B electrode of the NPN type triode (Q6) is connected with an end of the eighth resistor (R8); another end of the eighth resistor (R8) is connected with an end of the ninth resistor (R9) and the controller; and another end of the ninth resistor (R9) is grounded.

12. The automatic power off circuit as claimed in claim 11, wherein the power switch circuit comprises a PMOS transistor (Q2), a second resistor (R2) and a third resistor (R3); and wherein a S electrode of the PMOS transistor (Q2) is connected with an end of the second resistor (R2); a G electrode of the PMOS transistor (Q2) is connected with another end of the second resistor (R2) and an end of the third resistor (R3); another end of the third resistor (R3) is connected with the trigger circuit and the power on-off control circuit; and a D electrode of the PMOS transistor (Q2) is connected to the controller.

13. The automatic power off circuit as claimed in claim 12, wherein a resistance of the second resistor (R2) is 2 to 20 times of a resistance of the third resistor (R3).

14. The automatic power off circuit as claimed in claim 11, wherein the trigger circuit comprises a PMOS transistor (Q3), a fourth resistor (R4), a fifth resistor (R5), a sixth resistor (R6), a NMOS transistor (Q4), a fifth capacitor (C5), a diode (D1), a seventh resistor (R7), and a NPN type triode (Q5); and wherein a S electrode of the PMOS transistor (Q3) is connected with the power switch circuit and an end of the fourth resistor (R4); a G electrode of the PMOS transistor (Q3) is connected with an end of the fifth resistor (R5); a D electrode of the PMOS transistor (Q3) is connected with an end of the sixth resistor (R6) and an end of the fifth capacitor (C5); another end of the fourth resistor (R4) is connected with another end of the fifth resistor (R5), a G electrode of the NMOS transistor (Q4), and an end of the non-rebound switch; another end of the sixth resistor (R6) is connected with a D electrode of the NMOS transistor (Q4); a S electrode of the NMOS transistor (Q4) is grounded; another end of the fifth capacitor (C5) is connected to a negative electrode of the diode (D1) and an end of the seventh resistor (R7); a positive electrode of the diode (D1) is grounded; another end of the seventh resistor (R7) is connected with a B electrode of the NPN type triode (Q5); a C electrode of the NPN type triode (Q5) is connected to the power switch circuit and the power on-off control circuit; and an E electrode of the NPN type triode (Q5) is grounded.

15. The automatic power off circuit as claimed in claim 14, wherein a resistance of the fourth resistor (R4) is in a range of 1 MΩ to 10 MΩ.

16. An automatic power off circuit, comprising:

a power supply;

an anti-reverse connection circuit, connected with the power supply; wherein the anti-reverse connection circuit is configured to prevent the power supply from reverse connection;

a power switch circuit, connected with the anti-reverse connection circuit;

a controller, connected with the power switch circuit;

a voltage-regulator circuit, connected between the controller and the power switch circuit; wherein the voltage-regulator is configured to provide a stable voltage to the controller;

a power on-off control circuit, connected with the controller;

a non-rebound switch, connected with the power on-off control circuit; and a trigger circuit, connected with the anti-reverse connection circuit, the power switch circuit, the non-rebound switch and the power on-off control circuit;

wherein the trigger circuit is configured to output a turn-on signal to the power switch circuit in response to the non-rebound switch being turned on; and the power switch circuit is configured to turn on the power supply in response to the turn-on signal, to thereby enable the power supply to supply power to the controller through the anti-reverse connection circuit, the power switch circuit and the voltage-regulator circuit; and wherein the controller is configured to detect continuous turn-on time of the non-rebound switch and output a turn-off signal in response to the continuous turn-on time exceeding a preset timing time;

and the power on-off control circuit is configured to turn off the power switch circuit using the turn-off signal, to thereby turn off the power supply.

* * * * *